United States Patent [19]
Berger et al.

[11] Patent Number: 5,561,008
[45] Date of Patent: Oct. 1, 1996

[54] PROCESS FOR DEVICE FABRICATION USING PROJECTION LITHOGRAPHY AND AN APPARATUS THEREFOR

[75] Inventors: Steven D. Berger, Basking Ridge; James A. Liddle, Scotch Plains; George P. Watson, Harrison, all of N.J.

[73] Assignee: Lucent Technologies Inc., Murray Hill, N.J.

[21] Appl. No.: 379,052

[22] Filed: Jan. 27, 1995

[51] Int. Cl.⁶ ............................................ G03F 9/00
[52] U.S. Cl. ....................... 430/4; 430/5; 430/296; 430/311; 430/396; 430/494
[58] Field of Search ......................... 430/4, 296, 311, 430/395, 396, 494, 966, 967, 5

[56] References Cited

U.S. PATENT DOCUMENTS

| | | | |
|---|---|---|---|
| 5,079,112 | 1/1992 | Berger et al. | 430/396 |
| 5,130,213 | 7/1992 | Berger et al. | 430/396 |
| 5,258,246 | 11/1993 | Berger et al. | 430/396 |

OTHER PUBLICATIONS

Owen, G., Rissman, P., "Proximity Effect Correction for Electron Beam Lithography by Equalization of Background Dose", J. Appl. Phys. 54 (6) pp. 3573–3581, (Jun. 1983).

Primary Examiner—Thorl Chea
Attorney, Agent, or Firm—Richard J. Botos

[57] ABSTRACT

The invention is directed to a method and apparatus of projection lithography in which the contrast introduced into a radiation sensitive material caused by the proximity effect is effectively removed in a single exposure. Patterned radiation is transmitted through a lens system with at least one lens and a back focal plane filter. The back focal plane filter has at least two apertures, an image aperture and a proximity effect correction aperture. Patterned radiation is transmitted through the image aperture and introduces the desired image into the energy sensitive resist material. A portion of the inverse pattern radiation is transmitted through the proximity effect correction aperture and onto the energy sensitive resist material to effectively remove the contrast therein caused by the proximity effect.

5 Claims, 3 Drawing Sheets

PROCESS FOR DEVICE FABRICATION USING PROJECTION LITHOGRAPHY AND AN APPARATUS THEREFOR

FIELD OF THE INVENTION

BACKGROUND OF THE INVENTION

1. Technical Field

The present invention is detected to a process and apparatus for device fabrication in which an image of a pattern is projected onto an energy sensitive material by illuminating a patterned mask with radiation. The radiation transmitted through the mask is then passed through a back focal plane filter, which has an aperture trough which passes radiation with a certain degree of scatter. The radiation that passes through the back focal plane forms the image in the energy sensitive material.

2. Art Background

Methods for projection lithography in which a back focal plane filter used in a lens system interposed between a mask and the energy sensitive material are disclosed in U.S. Pat. No. 5,079,112, which is hereby incorporated by reference. As illustrated in FIG. 1, delineating energy, shown as rays 10, are directed onto a mask 20 which includes scattering regions 30 and less scattering regions 40. Rays are transmitted through both the scattering regions 30 and the less scattering regions 40. Scattering regions are regions in which the scatter angle of the radiation of consequence is above a maximum scatter angle. Less scattering regions are regions in which the scatter angle of the radiation is below a maximum scatter angle. The rays 11 that are transmitted trough the less scattering regions 40 are not significantly scattered. The rays 12 that are transmitted through the scattering regions 30 of the mask 20 are significantly scattered.

In the single lens system depicted in FIG. 1, the rays 11 and 12 transmitted through a lens 50 onto a back focal plane filter 60. The back focal plane filter is equipped with an aperture 70. The rays 11 are transmitted through the aperture 70 and onto certain portions of an energy-definable resist material. An image 90 of the pattern defined by the mask 20 is thereby introduced into the energy-definable resist material. Rays 12 are scattered beyond a critical scattering angle, and do not pass through the aperture 70, but instead are absorbed or otherwise blocked by the non-apertured portion 80 of the back focal plane filter 60. As described in detail in U.S. Pat. No. 5,079,112, the scattered rays 12 are selectively transmitted through the back focal plane filter to form a negative image in the energy-sensitive resist material if the back focal plane filter blocks the transmission of the unscattered rays and has apertures positioned to permit the transmission of the scattered rays therethrough.

In the above-described method, as well as in other methods for projection lithography, the radiation that is transmitted onto the desired regions of the energy-definable resist material scatters randomly in the energy definable resist material and the underlying substrate. This scattered radiation then exposes regions of the energy-definable material that are not intended to be exposed to the patterned radiation. The region of the energy-definable resist material that is adjacent to the exposed region is exposed to more backscattered radiation than the region of the energy-definable resist material that is not adjacent to the exposed region. This causes an unwanted contrast in the unexposed region of the energy-definable resist material. This unwanted contrast is known as the proximity effect and is described in Owen, G., et at., "Proximity effect correction for electron beam lithography by equalization of background dose," J. Appl. Phys. 54(6), pp. 3573–3581 (June 1983), which is hereby incorporated by reference. Owen et al. suggest using a correction exposure to correct for the proximity effect. The correction exposure mimics the distribution of the backscattered radiation in the reverse field of the pattern. This technique requires two exposures, the pattern exposure and the correction exposure. Since it is desirable from a manufacturing standpoint to limit the number of exposures, a method for proximity effect correction that does not require multiple exposures is desired.

SUMMARY OF THE INVENTION

The present invention contemplates an apparatus and process in which the proximity effect experienced in projection lithography is compensated for and the desired image is introduced into the energy-sensitive resist material in a single step. In the process and apparatus of the present invention, energy in the form of electron beams, electromagnetic (e.g. visible or non-visible light) or other radiation is incident on a mask. The mask has at least two regions: at least one of these regions does not significantly scatter the radiation transmitted therethrough; and at least one of these regions significantly scatters the electron beam or other radiation transmitted therethrough. In the context of the present invention, significant scattering means a scatter angle greater than the maximum scatter angle of radiation passed through some subsequent aperture. It follows that radiation without significant scattering (i.e. unscattered) is radiation with a scattering angle below a maximum scattering angle that permits the radiation to pass through some subsequent aperture. Thus unscattered radiation passes through some subsequent aperture while significantly scattered radiation does not.

Radiation transmitted through such a mask is patterned by the mask. The patterned radiation is then transmitted through a lens system onto the energy-sensitive resist material where it forms an image of the mask pattern. The lens system has at least a first lens that focuses the unscattered radiation through an aperture, denominated the image aperture, in a back focal plane filter. The back focal plane filter is positioned in the back focal plane, or some equivalent conjugate plane, of the lens in the lens system.

The back focal plane filter is also equipped with at least one other aperture, denominated the proximity effect correction aperture, through which a portion of the scattered radiation is transmitted. The size and placement of this aperture is selected to correct for the proximity effect. The size and placement of the proximity effect aperture is determined by calculating the amount of radiation that is absorbed by the back focal plane filter and the dose of radiation necessary to correct for the proximity effect. From this, the amount of scattered radiation needed to correct the proximity effect is determined. Once the amount of radiation necessary to correct for the proximity effect is determined, the aperture is placed so that the radiation is introduced into the appropriate regions of the energy sensitive resist material. The appropriate regions are those regions in which a dose of radiation must be introduced to reduce the contrast in the energy sensitive resist material caused by the proximity effect. This dose of radiation is called a correction exposure. The correction exposure is, in effect, the inverse of the pattern transmitted through the back focal plane filter because it is the radiation blocked by the back focal plane filter. The portion of the inverse pattern image that is transmitted through the proximity effect correction aperture is blurred by aberrations in the lens of the lens system. The position of the proximity effect correction aperture is selected so that, in conjunction with the aberrations of the lens in the lens system, the correction exposure radiation is targeted into the appropriate portion of the energy sensitive material. Once the proximity effect correction aperture is positioned in a given lens system, it can be used in that position for all correction exposures made with that lens system, i.e. the aperture does not need to be placed for each individual exposure.

In one embodiment of the invention, a second lens is interposed between the back focal plane filter and the energy sensitive material. This second lens focuses the unscattered radiation transmitted through the proximity effect correction aperture into the energy sensitive resist material to form an image of the mask pattern therein. The aberrations in this second lens focus the scattered radiation transmitted through the proximity effect correction aperture in a plane that is different from the plane of the energy sensitive resist material. The unexposed regions of the energy-sensitive resist material that were not subjected to backscatter radiation are thereby exposed to a dose of radiation that is comparable to the dose of backscatter radiation. In this regard the scatterer properties and the placement of the proximity effect correction aperture or apertures in the back focal plane filter are tailored to the aberrations in the particular lens to deliver the desired correction distribution dose to the energy sensitive material.

The apparatus of the present invention contains at least one lens that focuses the unscattered patterned radiation incident upon it from a mask. This lens focuses this radiation and transmits it through the image aperture in a back focal plane filter. This lens also transmits scattered patterned radiation incident upon it, but does not direct this radiation through the image aperture in the back focal plane filter. The back focal plane filter is also equipped with at least one proximity effect correction aperture that is interposed between the image aperture and the edge of the back focal plane filter. At least a portion of the scattered radiation incident on the back focal plane filter is transmitted through the proximity effect correction aperture.

The size and placement of the proximity effect correction aperture are selected so that the contrast in the energy sensitive material that is the result of the proximity effect is reduced. The size and placement of the aperture are selected so that the aperture, in conjunction with the aberrations in one of the lenses in the lens system, directs defocused radiation onto the energy sensitive resist material to correct the proximity effect.

DETAILED DESCRIPTION

In processes for device fabrication that utilize projection lithography, a portion of the radiation that is used to introduce an image of a pattern into an energy sensitive resist material typically spills into regions of the resist that are not intended to be exposed to radiation. This radiation "spillage" is the result of backscattering or diffraction effects. This is known as a proximity effect.

Figure 1:
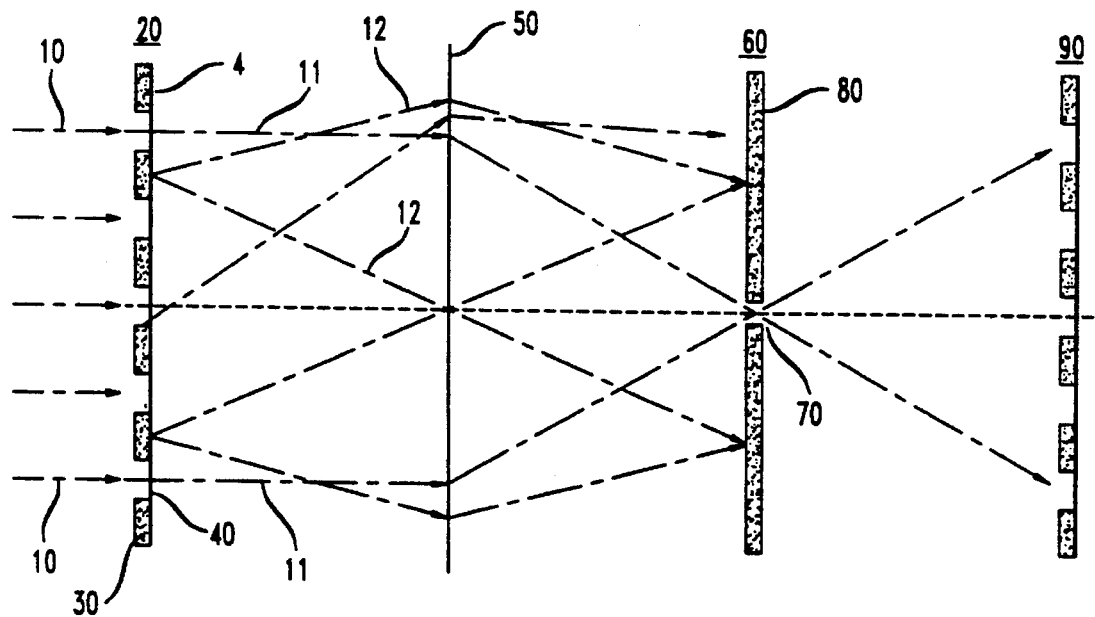
FIG. 1 is a schematic of a process for projection lithography in which patterned radiation passes through a back focal plane filter.
Figure 2:
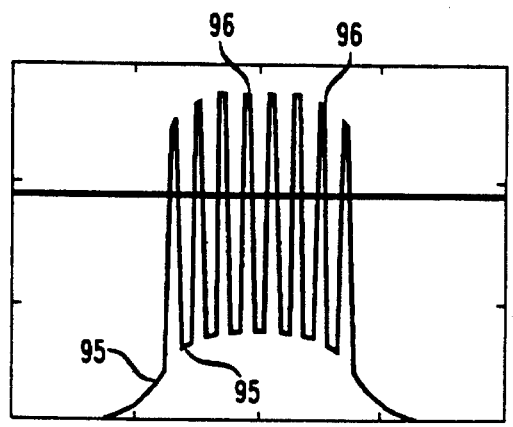
FIG. 2 illustrates a radiation dosage profile of an energy sensitive resist material that has been patternwise exposed to radiation using projection lithography.

These proximity effects occur in projection lithography at some level regardless of the type of radiation used to expose the energy sensitive resist material. Proximity effects occur in both optical lithography where the exposing radiation is electromagnetic radiation such as visible or non-visible light, as well as electron beam and ion beam lithography. The proximity effect for electron beam projection lithography, as illustrated by the radiation dose profile (an illustration of the radiation introduced into the energy sensitive material as a function of position) in FIG. 2, causes the areas of the energy-sensitive resist material that are adjacent to the exposed regions to be exposed to a dose of radiation. In FIG. 2 the exposed regions are indicated by the peaks 96 and the areas of the energy-sensitive resist material adjacent to the exposed regions 95 are the regions adjacent to the peaks 96. This results in poor feature dimension control in microelectronic circuit fabrication, because the proximity effect causes a contrast between the unexposed energy-sensitive resist material adjacent to the exposed region of the resist and the unexposed energy-sensitive resist material that is further from the exposed region of the energy-sensitive resist material. This contrast can cause significant errors in the features developed from the image. The resulting device may not be within acceptable manufacturing tolerances.

Figure 3:
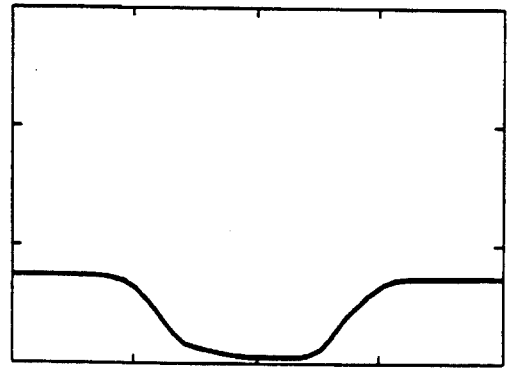
FIG. 3 illustrates a radiation dosage profile for an inverse exposure of the image depicted in FIG. 2 which is intended to compensate for proximity effects.
Figure 4:
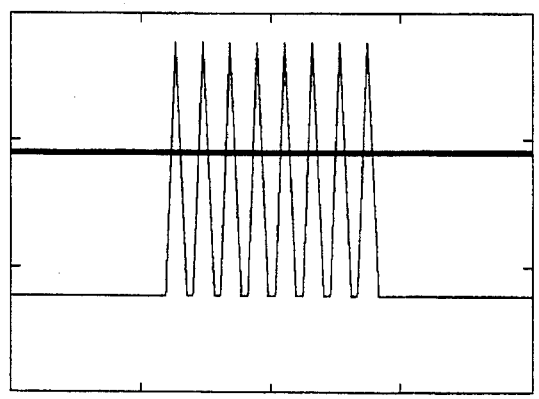
FIG. 4 is a dosage profile that is the combination of the dosage profiles in FIGS. 2 and 3.

To compensate for the contrast in the unexposed regions of the energy-sensitive material that is caused by the proximity effect, a defocused dose of patterned radiation is introduced into the energy-sensitive material. The dosage profile of this correction exposure is illustrated in FIG. 3. Comparing FIGS. 2 and 3, one will observe that the correction exposure in FIG. 3 is a somewhat inverse pattern of the exposure depicted in FIG. 2. As illustrated in FIG.4, this correction exposure effectively removes the contrast in the unexposed regions in the resist that is caused by backscattering. "Effectively removed," in this context means that any remaining contrast in the energy sensitive resist material that is the result of the proximity effect has no unacceptable lithographic consequences. Unacceptable lithographic consequences are those that render the fabricated device unsuitable for its intended purpose. Unacceptable lithographic consequences occur, for example, when the feature developed from the image is not within tolerable design limits. Currently these design limits are ± ten percent of the minimum line width.

In the present process and apparatus, patterned radiation is transmitted through an aperture in a back focal plane filter. The proximity effect correction exposure is also transmitted through at least one aperture in the back-focal plane filter. Consequently the primary exposure and the proximity effect exposure are capable of being accomplished in a single step. This is because the inverse pattern information from the mask is not lost in the lens system, it is simply not transmitted by the back focal plane filter. If at least one additional aperture is formed in the back focal plane filter, and the aperture has the appropriate size and location, sufficient inverse pattern information is transmitted through the back focal plane filter to effectively remove the contrast in the unexposed regions in the resist that is caused by the proximity effect.

Figure 5:
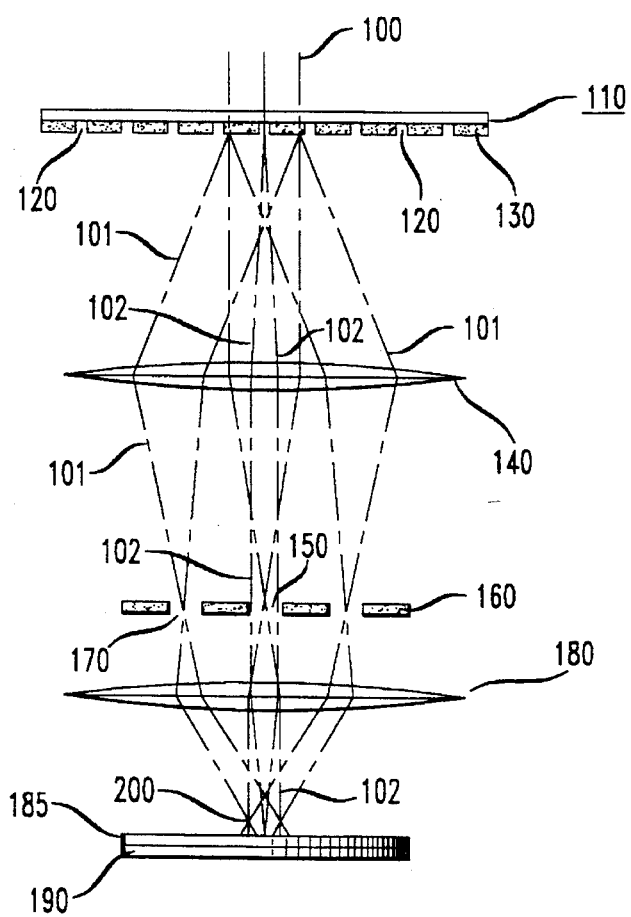
FIG. 5 is a schematic illustration of a two-lens embodiment of the present invention.

One embodiment of the present invention is illustrated in FIG. 5. Radiation such as electron beam radiation 100 is introduced incident onto a mask 110. The mask has a first region 120 that is transparent to the incident radiation 100 and a second region 130 that scatters the incident radiation that is transmitted therethrough. Scattering, as used herein, refers to an angular change in the transmission direction of the radiation that is transmitted through a material. For ease of description, reference is made herein to "scattered" and "unscattered" radiation. In principle, radiation that is transmitted through the transparent region of the mask is scattered to some extent. However, the angle of scatter is far less for radiation transmitted through the transparent region of the mask than for radiation that is transmitted through the other region of the mask. Therefore, the use of the terms scattered and unscattered is relative, i.e. "unscattered" connotes a scatter angle that is sufficiently low to permit the radiation to selectively pass through a particular aperture downstream of the mask and "scattered" means that the scatter angle is so high that the radiation will not pass through the same downstream aperture as the unscattered radiation. The radiation beams scattered by the mask are designated as beams 101, and the radiation beams that are unscattered are designated as 102.

All of the radiation that is transmitted through the mask 130 is incident on a first lens 140. The unscattered light is transmitted through the lens and directed through an image aperture 150 in a back focal plane filter 160. The back focal plane filter is also has proximity effect correction apertures 170. A portion of the scattered radiation 101 that is transmitted through the first lens 140 passes through the proximity effect correction apertures. The untransmitted portion of the scattered radiation (not illustrated) is absorbed by the back focal plane filter. The radiation that passes through the image aperture 150 and the proximity effect correction apertures 170 is incident on a second lens 180. The second lens directs the unscattred radiation 102 onto an energy sensitive material 185 formed on a wafer 190. The unscattered radiation forms an image of the mask 130 in the energy sensitive material 185. The second lens 180 has aberrations therein which focuses the scattered radiation 101 incident thereon in a plane 200 different from the surface of the energy sensitive material 185.

One skilled in the art is aware that aberrations are present in lenses. This phenomenon is described in Born, M., *Principles of Optics: Electromagnetic Theory of Propagation, Interference and Diffraction of Light* (6th ed. 1980) These aberrations cause a portion of the radiation transmitted through the lens to be dispersed by the lens. Where this radiation is dispersed depends upon the lens. Therefore, the placement of the proximity effect correction aperture in the back focal plane depends upon the aberrations in the particular lens used. The scattered radiation 101 is defocused when it reaches the energy sensitive material 185. Thus the scattered radiation compensates for the backscattering effects of the unscattered radiation 102 incident on the energy sensitive material by exposing those regions of the energy sensitive material 185 that are not subjected to backscattering to a dose of radiation that is equivalent to the backscater dosage.

Based upon the previous discussion, one skilled in the art will understand that the inverse pattern of the image introduced into the energy sensitive resist material is blocked (actually absorbed) by the back focal plane filter. By transmitting a portion of that inverse pattern information through a proximity effect correction aperture in the back focal plane filter, the contrast in the energy sensitive resist material that is caused by the proximity effect is effectively removed. As stated previously, the size of and placement of the proximity effect correction aperture is selected empirically, i.e., the size and placement of the aperture is manipulated until the desired effect is observed. However, one skilled in the art might also employ the modelling technique described in, for example, Owen et at. In order to employ Owen et et al.'s techniques, one must first determine the energy distribution in the back focal plane filter. In electron beam projection lithography, this distribution is calculated using the techniques described in Hirsch, P.B. et al., *Electron Microscopy of Thin Crystals*, (Butterworth, Pub. 1965), which is hereby incorporated by reference.

Figure 6:
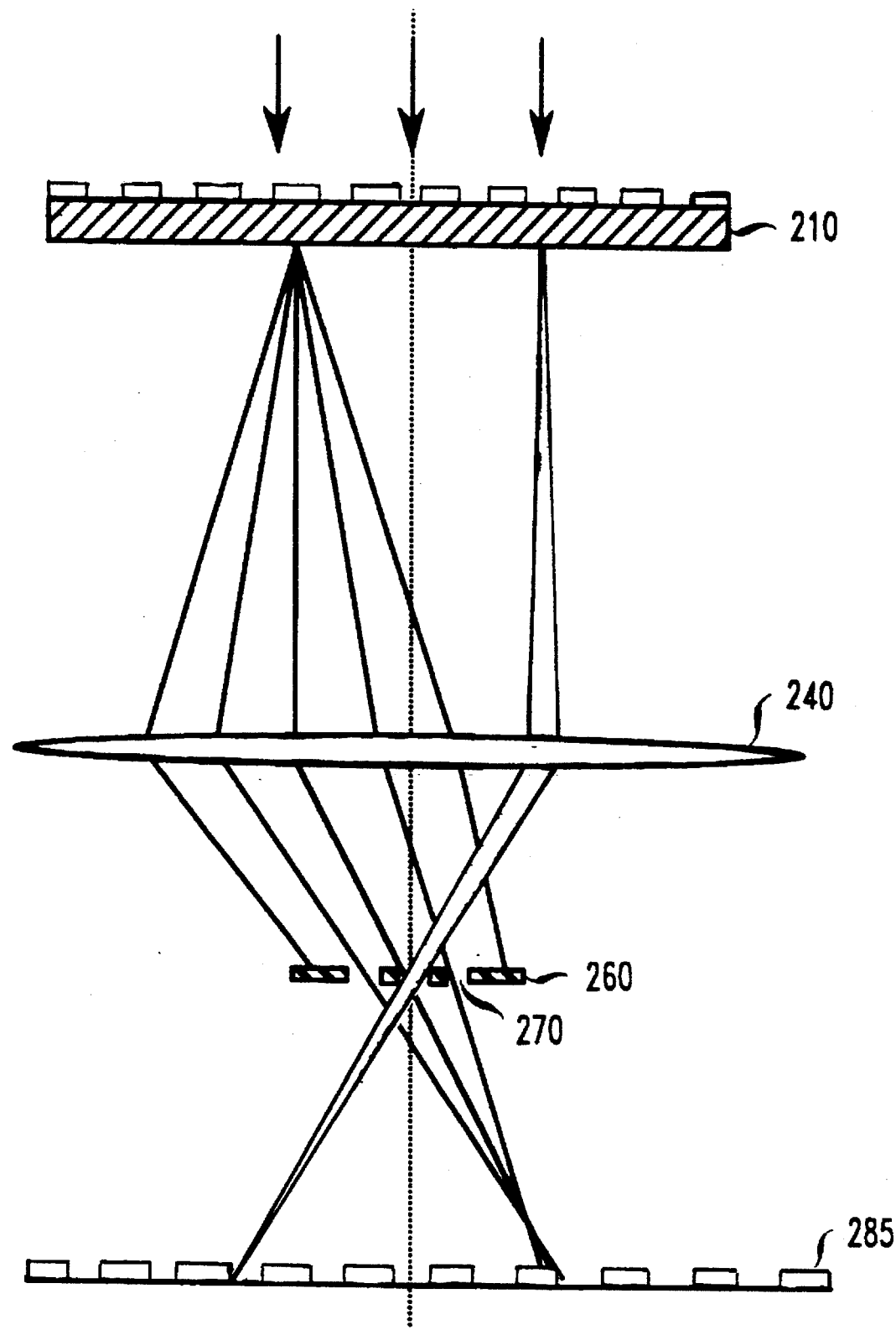
FIG. 6 is a schematic illustration of a one-lens embodiment of the present invention.

In another embodiment of the invention, the apparatus has one lens instead of the two previously described. This embodiment is illustrated in FIG. 6. In this embodiment, the placement of the proximity effect correction aperture 270 is selected so that, in conjunction with the aberrations in the lens 240 interposed between the mask 210 and the back focal plane filter 260, the correction exposure is introduced in the appropriate portion of the energy sensitive resist material 285 in order to effectively remove the contrast caused by the proximity effect.

We claim:

1. A method for device fabrication comprising:
    exposing an energy-sensitive material to patterned radiation wherein the radiation is patterned by illuminating a mask with radiation from a radiation source and wherein the mask has a first region that does not significantly scatter the illuminating radiation transmitted therethrough and a second region that significantly scatters the illuminating radiation transmitted therethrough and transmitting the patterned radiation through a lens system and onto the energy sensitive resist material wherein the lens system has at least one lens and a back focal plane filter which is positioned in the back focal plane or some equivalent conjugate plane of the lens in the lens system, the back focal plane filter having a first aperture which permits the passage of the insignificantly scattered radiation therethrough and at least one other aperture which permits the passage of a portion of the significantly scattered radiation therethrough.

2. The method of claim 1 wherein the insignificantly scattered radiation that passes through the first aperture and the significantly scattered radiation that passes through the second aperture are transmitted simultaneously onto the energy-sensitive material.

3. The method of claim 1 wherein the lens system comprises two lenses a first lens interposed between the mask and the back focal plane and a second lens interposed between the back focal plane filter and the energy sensitive material.

4. The method of claim 1 wherein the radiation is electron beam radiation.

5. The method of claim 1 wherein the radiation is electromagnetic radiation.

* * * * *